United States Patent
Lee et al.

(10) Patent No.: US 9,412,814 B2
(45) Date of Patent: Aug. 9, 2016

(54) STRUCTURE AND FORMATION METHOD OF FINFET DEVICE

(71) Applicant: Taiwan Semiconductor Manufacturing Co., Ltd, Hsin-Chu (TW)

(72) Inventors: Tung-Ying Lee, Hsinchu (TW); Yu-Lien Huang, Jhubei (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/582,975

(22) Filed: Dec. 24, 2014

(65) Prior Publication Data

US 2016/0190243 A1   Jun. 30, 2016

(51) Int. Cl.
| | | |
|---|---|---|
| *H01L 27/088* | (2006.01) | |
| *H01L 29/06* | (2006.01) | |
| *H01L 29/66* | (2006.01) | |
| *H01L 29/78* | (2006.01) | |
| *H01L 29/161* | (2006.01) | |
| *H01L 21/02* | (2006.01) | |
| *H01L 27/11* | (2006.01) | |
| *H01L 29/51* | (2006.01) | |

(52) U.S. Cl.
CPC ...... *H01L 29/0653* (2013.01); *H01L 21/02236* (2013.01); *H01L 21/02532* (2013.01); *H01L 27/1104* (2013.01); *H01L 29/0688* (2013.01); *H01L 29/161* (2013.01); *H01L 29/66795* (2013.01); *H01L 29/7848* (2013.01); *H01L 29/7851* (2013.01); *H01L 27/088* (2013.01); *H01L 29/517* (2013.01)

(58) Field of Classification Search
CPC . H01L 27/083; H01L 27/088; H01L 27/1104; H01L 27/0924; H01L 29/165; H01L 29/4966; H01L 29/517; H01L 21/02532; H01L 29/0653; H01L 29/7851
USPC .................................................. 257/295, 288
See application file for complete search history.

(56) References Cited

U.S. PATENT DOCUMENTS

| | | | | |
|---|---|---|---|---|
| 2006/0141706 A1* | 6/2006 | Hong | ................ | H01L 27/11521 438/257 |
| 2012/0126885 A1* | 5/2012 | Juengling | ....... | H01L 21/823431 327/581 |
| 2012/0256238 A1* | 10/2012 | Ning | ........................ | H01L 21/84 257/280 |
| 2013/0001591 A1* | 1/2013 | Wu | .................. | H01L 21/823821 257/77 |
| 2013/0056826 A1* | 3/2013 | Liu | .................. | H01L 21/823431 257/347 |
| 2013/0093026 A1* | 4/2013 | Wann | .............. | H01L 21/823821 257/401 |
| 2013/0161729 A1* | 6/2013 | Xie | ................... | H01L 29/66795 257/329 |
| 2013/0200449 A1* | 8/2013 | Chen | ............... | H01L 21/823431 257/296 |
| 2014/0070316 A1* | 3/2014 | Chan | ............... | H01L 21/823412 257/347 |
| 2014/0097496 A1* | 4/2014 | Hu | .................. | H01L 21/823481 257/368 |
| 2014/0145270 A1* | 5/2014 | Cheng | .................. | H01L 27/088 257/368 |
| 2014/0312432 A1* | 10/2014 | Ching | ............... | H01L 29/66795 257/401 |

* cited by examiner

*Primary Examiner* — Nathan Ha

(74) *Attorney, Agent, or Firm* — Birch, Stewart, Kolasch & Birch, LLP

(57) ABSTRACT

Structures and formation methods of a semiconductor device are provided. The semiconductor device structure includes a semiconductor substrate and a fin structure over the semiconductor substrate. The semiconductor device structure also includes a gate stack covering a portion of the fin structure and a source/drain structure over the fin structure and adjacent to the gate stack. The semiconductor device structure further includes an isolation layer between the source/drain structure and the semiconductor substrate.

20 Claims, 16 Drawing Sheets

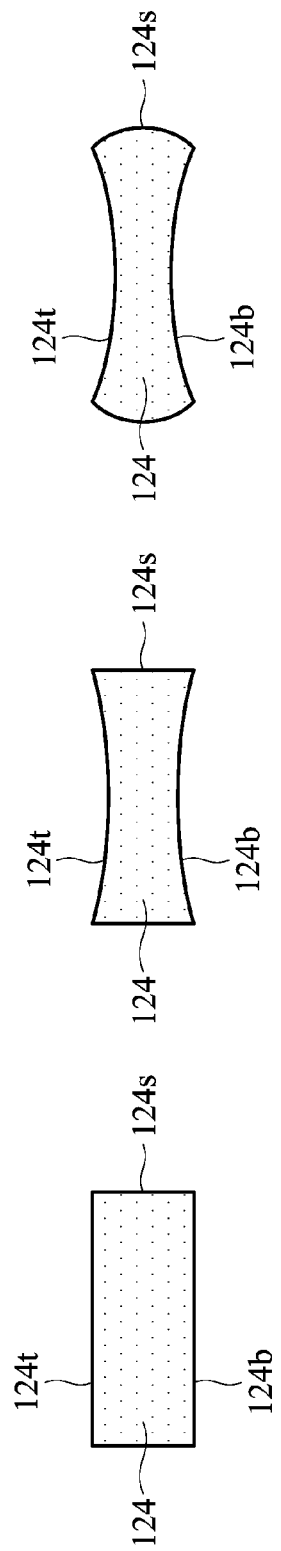
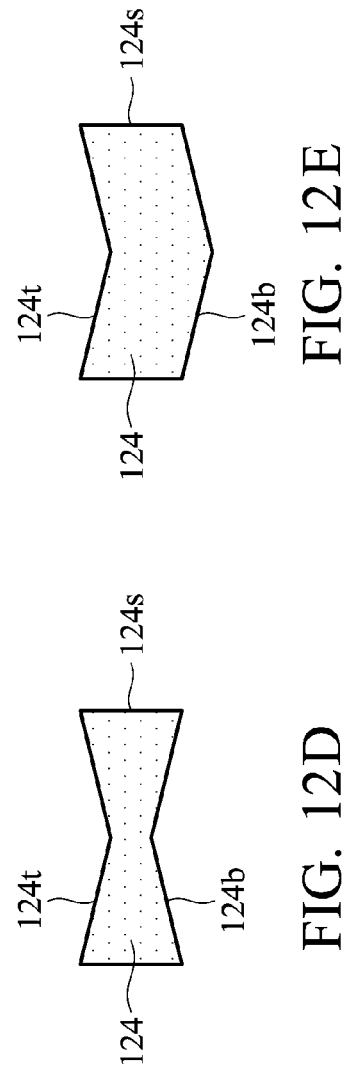

STRUCTURE AND FORMATION METHOD OF FINFET DEVICE

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. The scaling-down process generally provides benefits by increasing production efficiency and lowering associated costs.

Despite groundbreaking advances in materials and fabrication, scaling planar devices such as a metal-oxide-semiconductor field effect transistor (MOSFET) device has proven challenging. To overcome these challenges, circuit designers look to novel structures to deliver improved performance, which has resulted in the development of three-dimensional designs, such as fin-like field effect transistors (FinFETs). The FinFET is fabricated with a thin vertical "fin" (or fin structure) extending up from a substrate. The channel of the FinFET is formed in this vertical fin. A gate is provided over the fin to allow the gate to control the channel from multiple sides. Advantages of the FinFET may include a reduction of the short channel effect, reduced leakage, and higher current flow.

However, since feature sizes continue to decrease, fabrication processes continue to become more difficult to perform. Therefore, it is a challenge to form a reliable semiconductor device including the FinFET.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 12A-12E are cross-sectional views of isolation layers of semiconductor device structures, in accordance with some embodiments.

DETAILED DESCRIPTION

Figure 2:
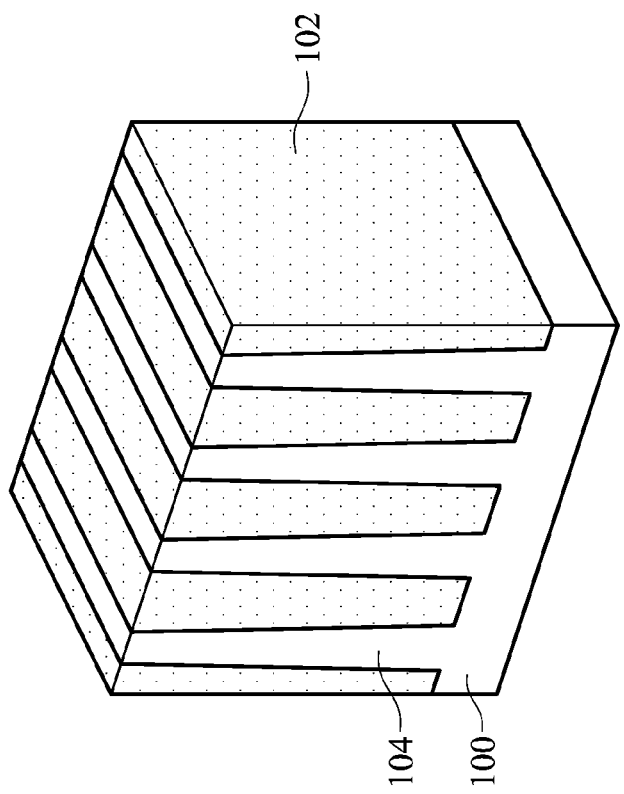
FIGS. 1-6 are perspective views of various stages of a process for forming a semiconductor device structure, in accordance with some embodiments.
Figure 1:
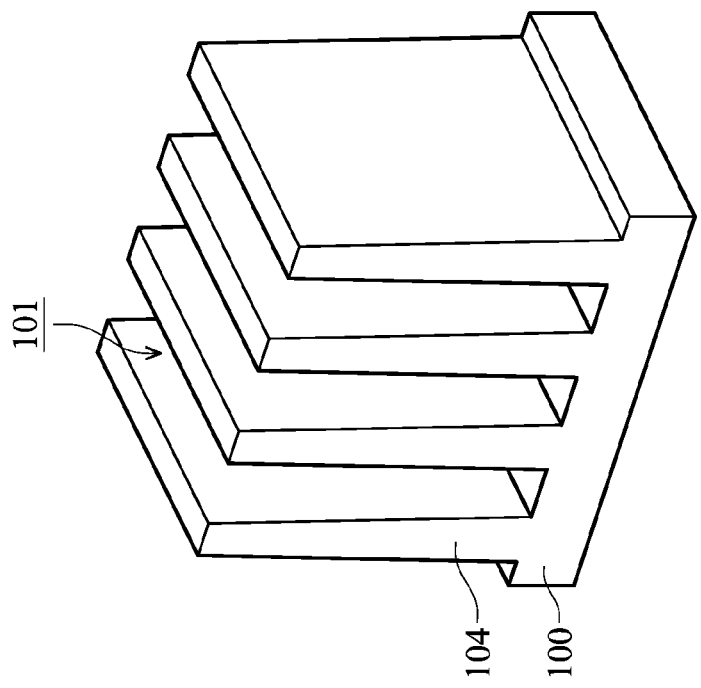

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 7B:
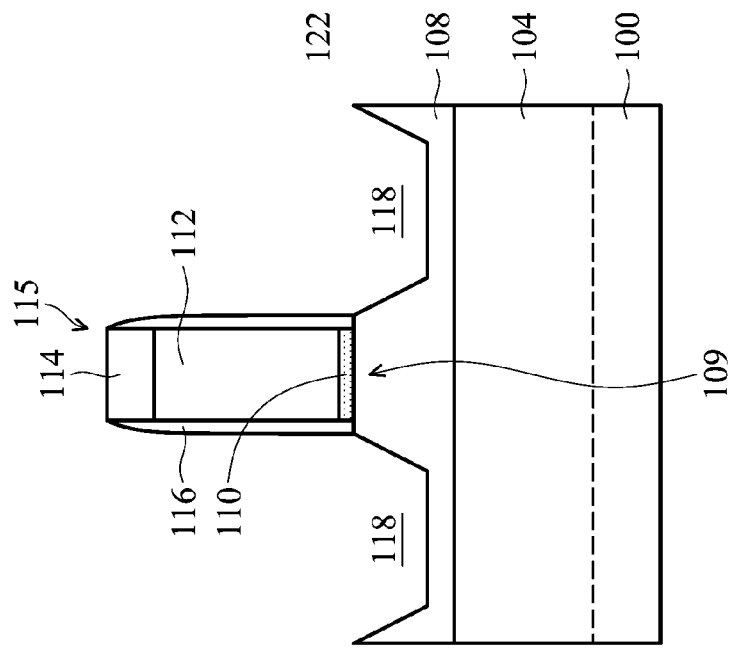
FIG. 7B is a cross-sectional view of a portion of the structure shown in FIG. 7A, in accordance with some embodiments.
Figure 7A:
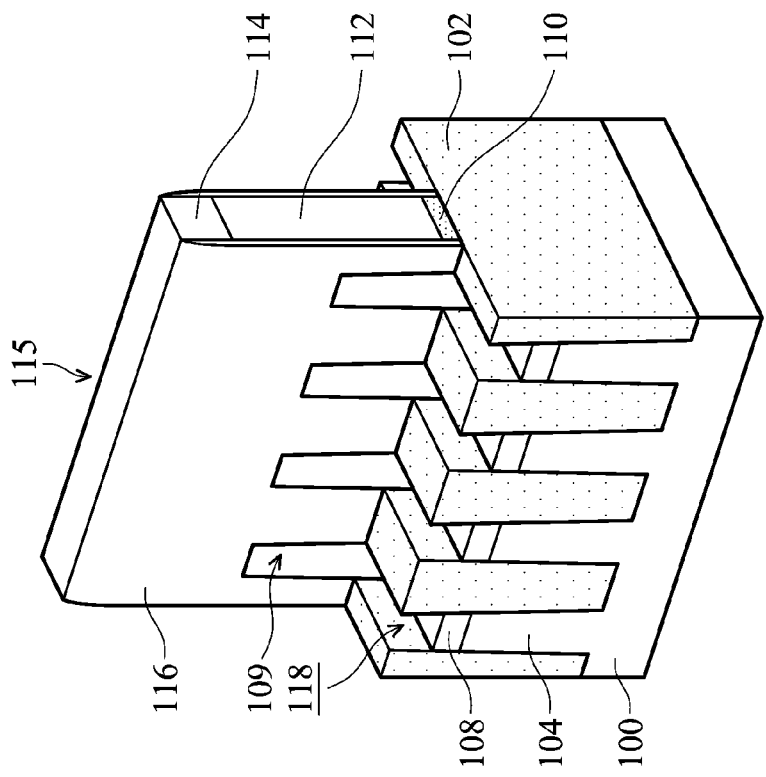
FIG. 7A is a perspective view of a stage of a process for forming a semiconductor device structure, in accordance with some embodiments.
Figure 8B:
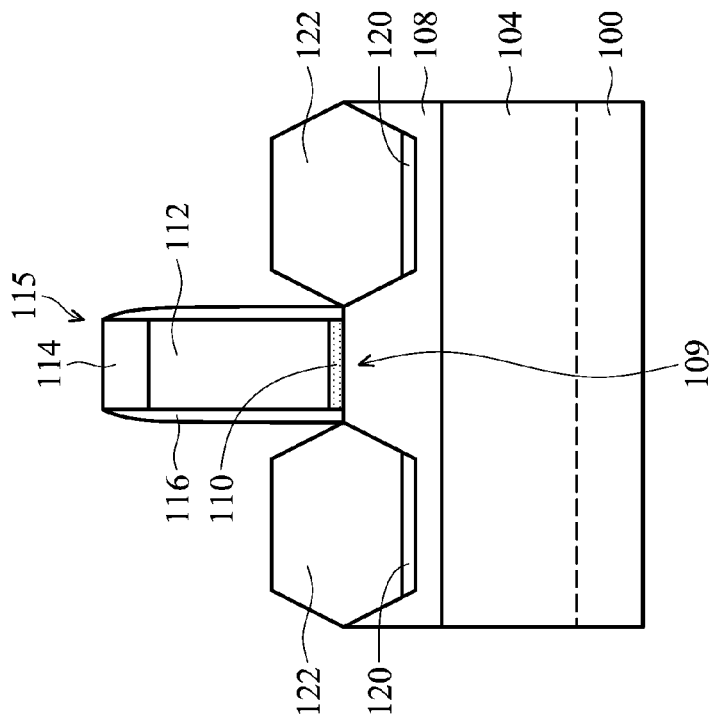
FIG. 8B is a cross-sectional view of a portion of the structure shown in FIG. 8A, in accordance with some embodiments.
Figure 8A:
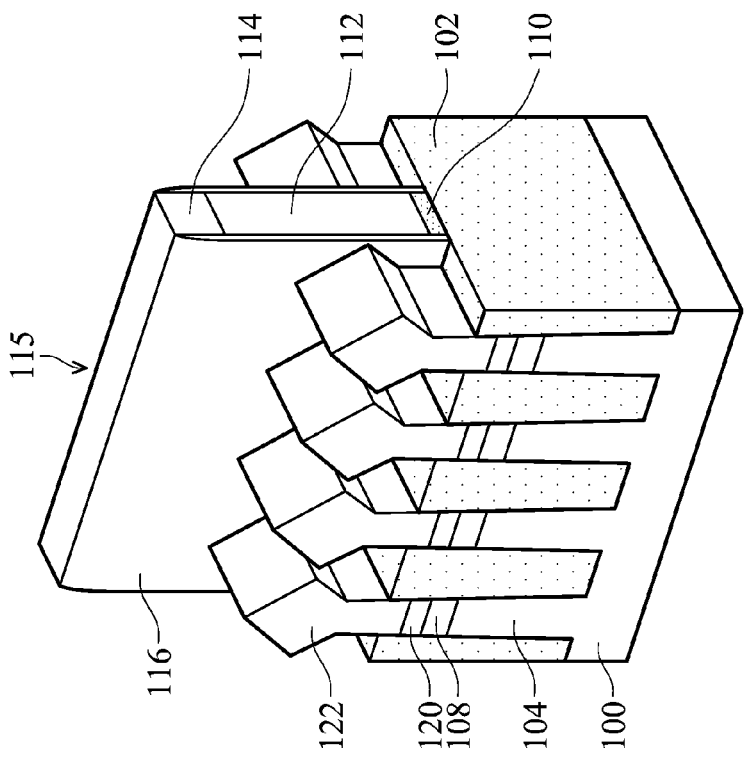
FIG. 8A is a perspective view of a stage of a process for forming a semiconductor device structure, in accordance with some embodiments.
Figure 9B:
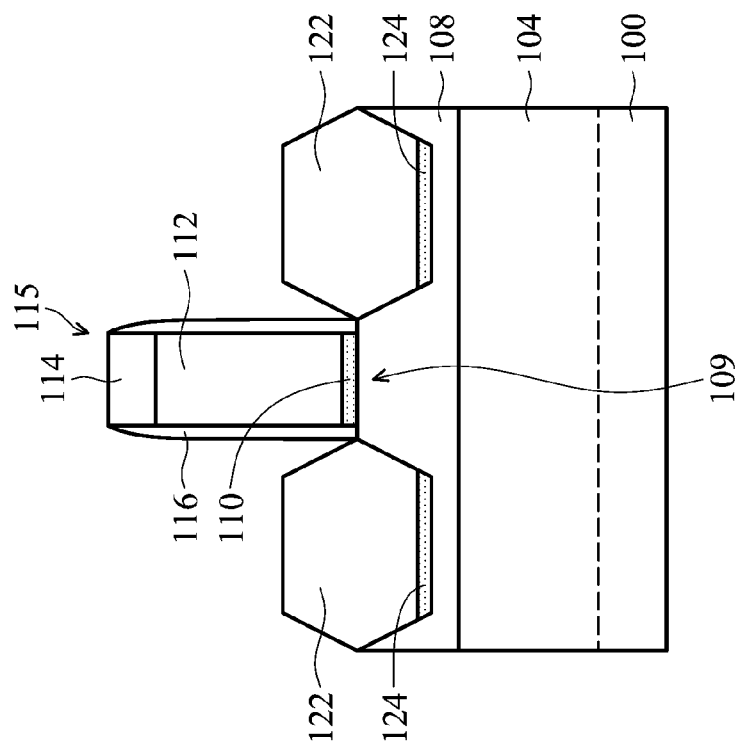
FIG. 9B is a cross-sectional view of a portion of the structure shown in FIG. 9A, in accordance with some embodiments.
Figure 9A:
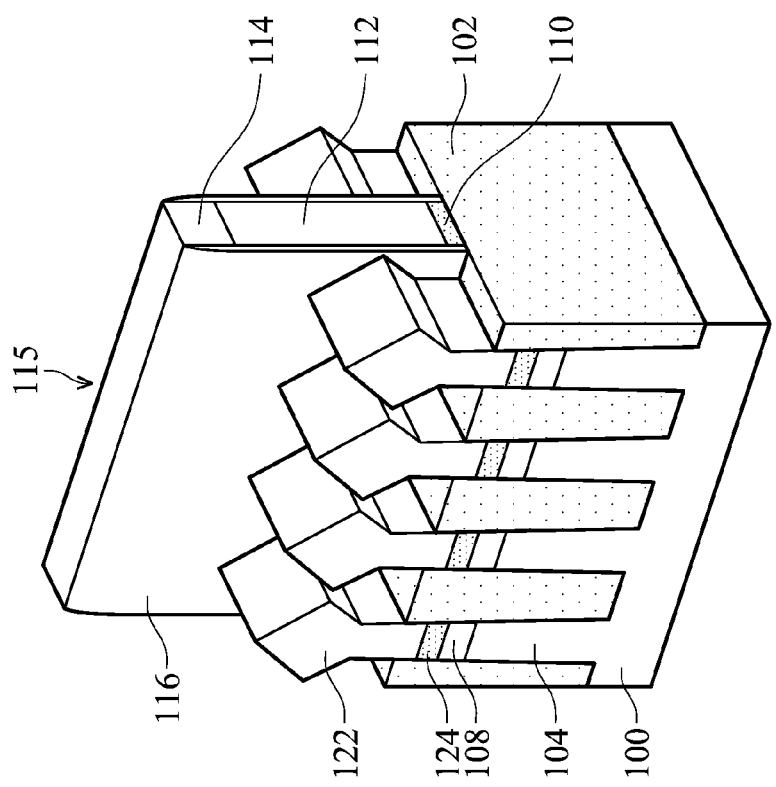
FIG. 9A is a perspective view of a stage of a process for forming a semiconductor device structure, in accordance with some embodiments.

Some embodiments of the disclosure are described. FIGS. 1-6 are perspective views of various stages of a process for forming a semiconductor device structure, in accordance with some embodiments. Additional operations can be provided before, during, and/or after the stages described in FIGS. 1-6. FIGS. 7A, 8A, and 9A are perspective views of various stages of a process for forming a semiconductor device structure. FIGS. 7B, 8B, and 9B are cross-sectional views each respectively showing a portion of the structures shown in FIGS. 7A, 8A, and 9A, in accordance with some embodiments. Some of the stages described can be replaced or eliminated for different embodiments. Additional features can be added in the semiconductor device. Some of the features described below can be replaced or eliminated for different embodiments.

As shown in FIG. 1A, multiple recesses 101 (or trenches) are formed in a semiconductor substrate 100 to form multiple fin structures 104 between the recesses 101, in accordance with some embodiments. In some embodiments, one or more photolithography and etching processes are used to form the recesses 101. In some embodiments, the semiconductor substrate 100 is a bulk semiconductor substrate. The bulk semiconductor substrate may be a semiconductor wafer such as a silicon wafer. In these cases, the fin structures 104 are silicon fin structures. In some embodiments, the semiconductor substrate 100 includes an elementary semiconductor material such as silicon or other elementary semiconductor materials such as germanium. In some other embodiments, the semiconductor substrate 100 includes a compound semiconductor. The compound semiconductor may include silicon carbide, gallium arsenide, indium arsenide, indium phosphide, another suitable compound semiconductor, or a combination thereof.

In some embodiments, the semiconductor substrate 100 is a semiconductor-on-insulator (SOI) substrate. The SOI substrate may be fabricated by using a separation by implantation of oxygen (SIMOX) process, a wafer bonding process, another applicable method, or a combination thereof.

As shown in FIG. 2, isolation features 102 are formed in the recesses 101 to surround the fin structures 104, in accordance with some embodiments. The isolation features 102 are used to define and electrically isolate various device elements formed in and/or over the semiconductor substrate 100. In some embodiments, the isolation features 102 include shallow trench isolation (STI) features, local oxidation of silicon (LOCOS) features, other suitable isolation features, or a combination thereof.

In some embodiments, each of the isolation features 102 has a multi-layer structure. In some embodiments, the isolation features 102 are made of a dielectric material. The dielectric material may include silicon oxide, silicon nitride, silicon oxynitride, fluoride-doped silicate glass (FSG), low-K dielectric material, other suitable materials, or a combination thereof. In some embodiments, an STI liner (not shown) is formed to reduce crystalline defects at the interface between the semiconductor substrate 100 and the isolation features 102.

In some embodiments, a dielectric material layer is deposited over the semiconductor substrate 100. The dielectric material layer covers the fin structures 104 and fills the recesses 101. In some embodiments, the dielectric material layer is deposited using a chemical vapor deposition (CVD) process, a spin-on process, another applicable process, or a combination thereof. In some embodiments, a planarization process is performed to thin down the dielectric material layer until the fin structures 104 are exposed. The planarization process may include a chemical mechanical polishing (CMP) process, a grinding process, an etching process, another applicable process, or a combination thereof.

Figure 4:
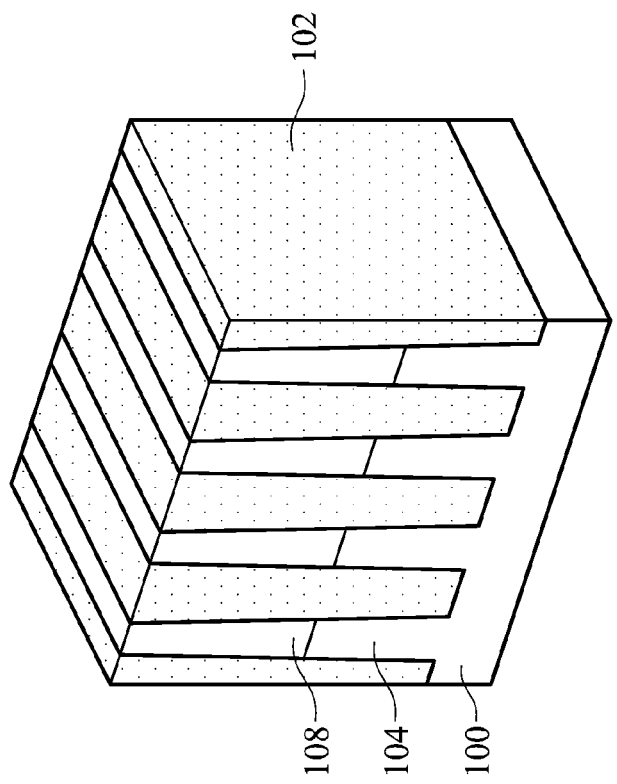
Figure 3:
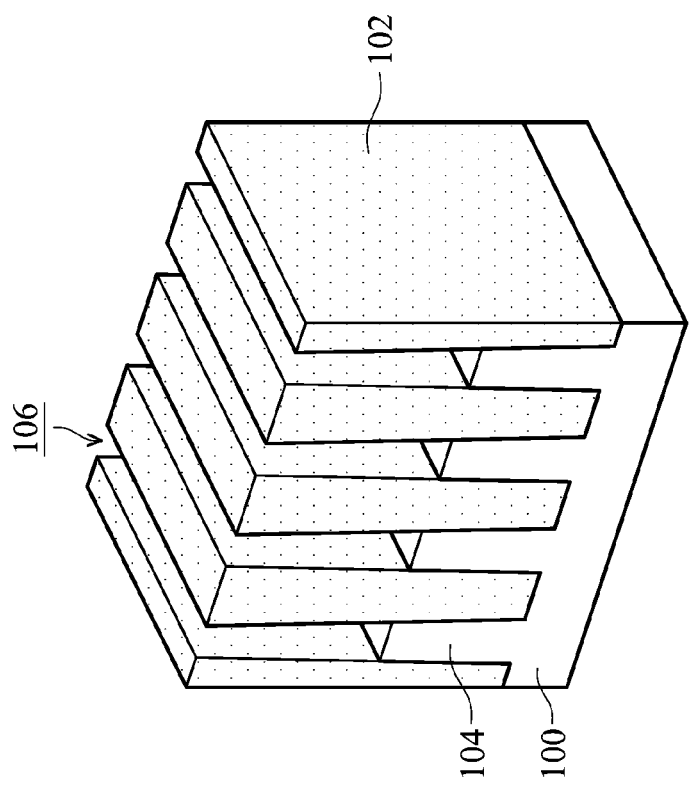

As shown in FIGS. 3 and 4, upper portions of the fin structure 104 are replaced with other fin structures 108, in accordance with some embodiments. As shown in FIG. 3, the upper portions of the fin structures 104 are removed to form recesses 106 (or trenches) between the isolation features 102. An etching process may be used to partially remove the fin structures 104 and form the recesses 106.

Afterwards, the fin structures 108 are formed over the fin structures 104 to fill the recesses 106, as shown in FIG. 4. In some embodiments, the fin structures 108 are made of a semiconductor material that is different from that of the fin structures 104. In some embodiments, the fin structures 108 are germanium-containing fin structures. In some embodiments, the fin structures 104 are made of silicon. The fin structures 108 may be made of silicon germanium (SiGe), germanium (Ge), another suitable semiconductor material, or a combination thereof. The fin structures 108 may be used to provide high mobility channel regions.

In some embodiments, the fin structures 108 are epitaxially grown fin structures. The fin structures 108 may be formed using a selective epitaxy growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof. In some embodiments, a semiconductor material is grown in the recesses 106 to a level that is substantially as high as the top surfaces of the isolation features 102. As a result, the semiconductor material forms the fin structures 108. In some other embodiments, the semiconductor material is grown to overfill the recesses 106. Afterwards, a planarization process (such as a CMP process) is performed to remove the portion of the semiconductor material outside of the recesses 106. As a result, the remaining portions of the semiconductor material form the fin structures 108.

Figure 5:
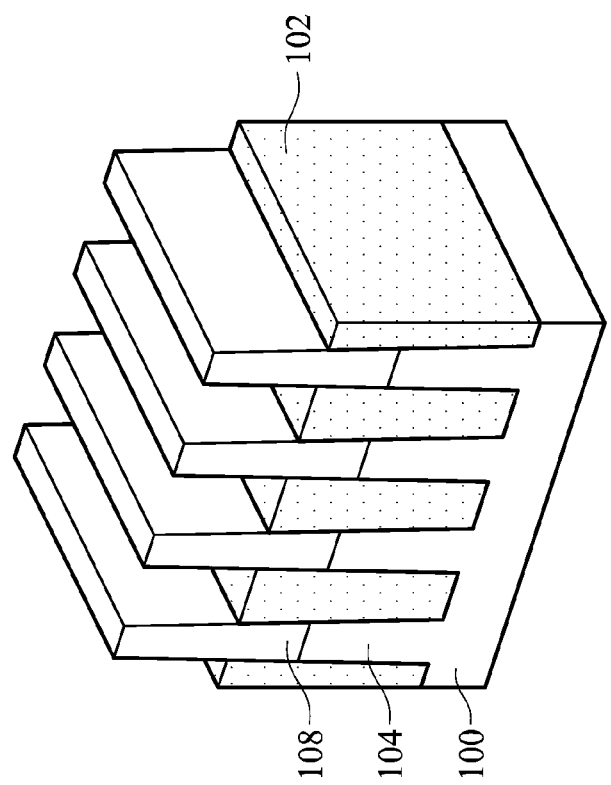

As shown in FIG. 5, upper portions of the isolation features 102 are removed such that the fin structures 108 protrude from the remaining portions of the isolation features 102, in accordance with some embodiments. An etching process may be used to partially remove the isolation features 102.

Figure 6:
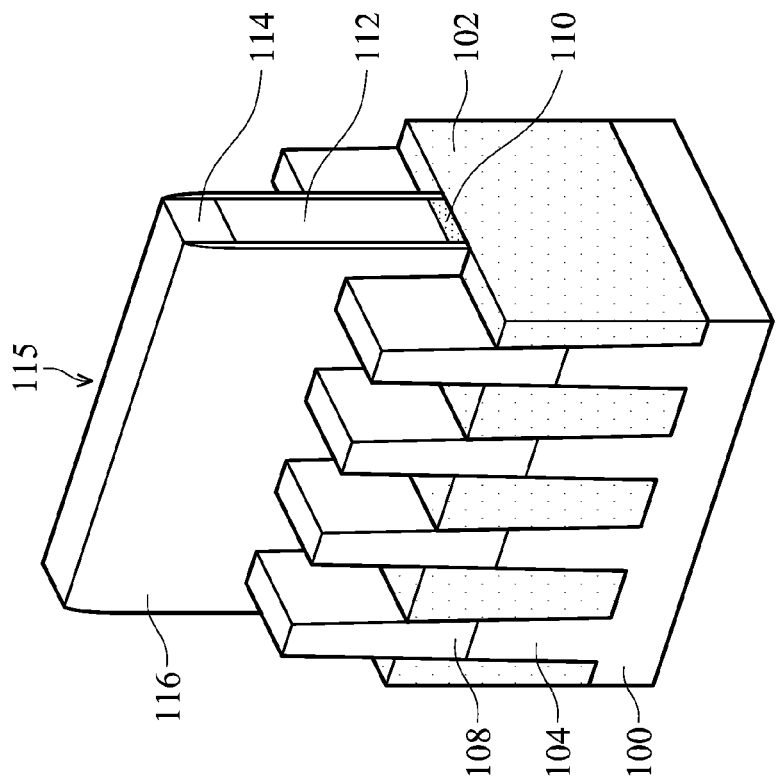

As shown in FIG. 6, a gate stack 115 is formed over the fin structures 108 and the isolation features 102, in accordance with some embodiments. In some embodiments, the gate stack 115 includes a gate dielectric layer 110, a gate electrode 112, and a hard mask 114. In some embodiments, the gate stack 115 further includes spacer elements 116, as shown in FIG. 6. In some other embodiments, the spacer elements 116 are not formed at this stage. In some other embodiments, the spacer elements 116 are not formed.

In some embodiments, the gate dielectric layer 110 is made of silicon oxide, silicon nitride, silicon oxynitride, dielectric material with a high dielectric constant (high-K), another suitable dielectric material, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 110 is a dummy gate dielectric layer which will be removed in a subsequent process. The dummy gate dielectric layer is, for example, a silicon oxide layer.

In some embodiments, the gate electrode 112 includes polysilicon, a metal material, another suitable conductive material, or a combination thereof. In some embodiments, the gate electrode 112 is a dummy gate electrode layer and will be replaced with another conductive material such as a metal material. The dummy gate electrode layer is made of, for example, polysilicon.

The hard mask 114 may be used to assist in the patterning process for forming the gate stack 115. In some embodiments, the hard mask 114 is made of silicon oxide, silicon nitride, silicon oxynitride, silicon carbide, another suitable material, or a combination thereof. In some embodiments, the hard mask 114 has a multi-layer structure.

In some embodiments, a gate dielectric material, a gate electrode layer, and a hard mask layer are deposited over isolation features 102 and the fin structures 108. In some embodiments, the gate dielectric material, the gate electrode layer, and the hard mask layer are sequentially deposited by using suitable deposition methods. The suitable deposition methods may include a chemical vapor deposition (CVD) process, an atomic layer deposition (ALD) process, a thermal oxidation process, a physical vapor deposition (PVD) process, another applicable process, or a combination thereof.

Afterwards, a photolithography process and an etching process are performed to pattern the hard mask layer to be the hard mask 114. With the assistance of the hard mask 114, the gate electrode layer and the gate dielectric material are patterned. As a result, the gate stack 115 is formed.

The spacer elements 116 may be used to protect the gate electrode 112 and/or assist in the formation of source and drain structures (or regions) in subsequent processes. In some embodiments, the spacer elements 116 are made of silicon nitride, silicon oxynitride, silicon carbide, another suitable material, or a combination thereof. In some embodiments, a spacer layer is deposited and partially removed using an anisotropic etching process. As a result, the remaining portions of the spacer layer form the spacer elements 116.

As shown in FIGS. 7A and 7B, the fin structures 108 are recessed to be lower than the isolation features 102, in accordance with some embodiments. In some embodiments, an etching process is performed to remove upper portions of the fin structures 108. As a result, recesses 118 are formed above the fin structures 108, as shown in FIGS. 7A and 7B. In some embodiments, multiple etching operations are used so that the recesses 118 further extend laterally towards channel regions 109 below the gate stack 115.

As shown in FIGS. 8A and 8B, semiconductor layers 120 are formed over the fin structure 108 in the recesses 118, in accordance with some embodiments. Afterwards, source/drain structures 122 are respectively formed over the semiconductor layers 120, as shown in FIGS. 8A and 8B in accordance with some embodiments. The source/drain structures 122 may be used to provide stress or strain to the channel regions 109 under the gate stack 115. As a result, the carrier mobility of the device and device performance are improved.

In some embodiments, a semiconductor material is epitaxially grown over the fin structures 108 to form the semiconductor layers 120. Afterwards, another semiconductor material (or two or more semiconductor materials) is epitaxially grown over the semiconductor layers 120, growing continually to above the recesses 118, to form the source/drain structures 122. In some embodiments, the growth of the semiconductor layers 120 and the source/drain structures 122 are performed continuously. In these cases, the semiconductor layers 120 are in direct contact with the source/drain structures 122, respectively.

In some other embodiments, the source/drain structures 122 are a p-type semiconductor material. For example, the source/drain structures 122 may include epitaxially grown silicon germanium. The source/drain structures 122 are not limited to being a p-type semiconductor material. In some embodiments, the source/drain structures 122 are an n-type semiconductor material. The source/drain structures 122 may include epitaxially grown silicon, epitaxially grown silicon carbide (SiC), epitaxially grown silicon phosphide (SiP), or another suitable epitaxially grown semiconductor material.

In some embodiments, both the semiconductor layers 120 and the source/drain structures 122 are formed by using a selective epitaxy growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof. The formation process of the semiconductor layers 120 and the source/drain structures 122 may use gaseous and/or liquid precursors. In some embodiments, both the semiconductor layers 120 and the source/drain structures 122 are grown in-situ in the same process chamber. In other words, the semiconductor layers 120 and the source/drain structures 122 are formed sequentially by using an in-situ epitaxial growth process. After the semiconductor layers 120 are formed, the composition of the precursor for growing the semiconductor layers 120 is fine-tuned to grow continually until the source/drain structures 122 are formed.

In some embodiments, the source/drain structures 122 are made of silicon germanium, and the semiconductor layers 120 are also made of silicon germanium. Many variations and modifications can be made to embodiments of the disclosure. In some other embodiments, the source/drain structures 122 are made of germanium, and the semiconductor layers 120 are also made of germanium. In some other embodiments, the semiconductor layers 120 are made of germanium, and the source/drain structures 122 are made of silicon germanium.

However, it should be noted that the composition of the semiconductor layers 120 and of the source/drain structures 122 are not completely the same. In some embodiments, the semiconductor layer 120 has an atomic concentration of germanium greater than that of the source/drain structures 122. In some embodiments, the atomic concentration of germanium of the semiconductor layer 120 is greater than that of the source/drain structure 122 by about 20%. The atomic concentration of germanium of the semiconductor layer 120 may be in a range from about 20% to about 100%. The atomic concentration of germanium of the source/drain structure 122 may be in a range from about 20% to about 80%. In these cases, the source/drain structure 122 may be a portion of a PMOS device. In some other embodiments, the atomic concentration of germanium of the source/drain structure 122 is in a range from about 1% to about 20%. In these cases, the source/drain structure 122 is a portion of a NMOS device. In some other embodiments, the source/drain structure 122 contains substantially no germanium.

In some embodiments, the source/drain structures 122 are doped with one or more suitable dopants. For example, the source/drain structures 122 are SiGe source/drain features doped with boron (B) or another suitable dopant. Alternatively, in some other embodiments, the source/drain structures 122 are Si source/drain features doped with phosphor (P), antimony (Sb), or another suitable dopant.

In some embodiments, the source/drain structures 122 are doped in-situ during the growth of the source/drain structures 122. In some other embodiments, the source/drain structures 122 are not doped during the growth of the source/drain structures 122. After the formation of the source/drain structures 122, the source/drain structures 122 are doped in a subsequent process. In some embodiments, the doping is achieved by using an ion implantation process, a plasma immersion ion implantation process, a gas and/or solid source diffusion process, another applicable process, or a combination thereof. In some embodiments, the source/drain structures 122 are further exposed to annealing processes to activate the dopants. For example, a rapid thermal annealing process is performed.

Many variations and modifications can be made to embodiments of the disclosure. For example, the spacer elements 116 are not limited to being formed prior to the formation of the source/drain structure 122. In some other embodiments, the spacer elements 116 are formed after the formation of the source/drain structure 122. In some other embodiments, the spacer elements 116 are formed after the source/drain structures 122 are formed and before the source/drain structures 122 are implanted and annealed.

As shown in FIGS. 9A and 9B, the semiconductor layers 120 are oxidized to form isolation layers 124, in accordance with some embodiments. The isolation layers 124 may prevent current leakage between the source/drain structures 122 of neighboring FinFET devices or the same FinFET device.

Since the current leakage is reduced, the performance and reliability of the device are significantly improved.

In some embodiments, the isolation layers 124 are in direct contact with the source/drain structures 122, respectively. In some embodiments, the isolation layers 124 are in direct contact with the fin structures 108. In some embodiments, the isolation layer 124 is made of a semiconductor oxide material. In some embodiments, the isolation layers 124 are made of silicon germanium oxide. In some other embodiments, the isolation layers 124 are made of germanium oxide if the semiconductor layers 120 are made of germanium. In some embodiments, the thickness of each of the isolation layers 124 is in a range from about 0.2 nm to about 100 nm.

In some embodiments, the semiconductor layers 120 are oxidized to form the isolation layers 124 using an annealing process. Studies show that the more germanium a silicon germanium layer contains, the easier the silicon germanium is oxidized. As mentioned above, the semiconductor layer 120 has an atomic concentration of germanium that is greater than that of the source/drain structures 122 in some embodiments. Therefore, by fine-tuning the annealing conditions, the semiconductor layers 120 can be oxidized into the isolation layers 124 without or substantially without the oxidation of the source/drain structures 122.

In some embodiments, the semiconductor layers 120 are annealed under an oxygen-containing atmosphere. In some other embodiments, the semiconductor layers 120 are annealed under an oxygen-free atmosphere. In some embodiments, the semiconductor layers 120 are annealed at a temperature ranging from about 800 degrees C. to about 1300 degrees C. for about 1 second to about 10 seconds. In some other embodiments, the semiconductor layers 120 are annealed at a temperature ranging from about 800 degrees C. to 1200 degrees C. for about 30 seconds to about 1 minute. In some other embodiments, the semiconductor layers 120 are annealed at a temperature ranging from about 400 degrees C. to 1200 degrees C. for about 1 hour to about 2 hours.

Many variations and modifications can be made to embodiments of the disclosure. For example, the isolation layers 124 are not limited to being formed using an annealing process. In some other embodiments, the semiconductor layers 120 are oxidized using an oxygen-containing plasma operation to form the isolation layers 124. The plasma operation may include an inductively coupled plasma (ICP) operation, a transformer coupled plasma (TCP) operation, another applicable plasma operation, or a combination thereof. In some other embodiments, the semiconductor layers 120 are oxidized using an electron cyclotron resonance (ECR) process, a reactive ion etch process with oxygen-containing reaction gas, a downstream striper process, another applicable process, or a combination thereof.

In some embodiments mentioned above, the isolation layers 124 are formed after the formation of the source/drain structures 122 by oxidizing semiconductor layers under the source/drain structures 122. However, embodiments of the disclosure are not limited thereto. Many variations and modifications can be made to embodiments of the disclosure. For example, the isolation layers used for preventing leakage current may be formed before the formation of the source/drain structures.

Afterwards, various processes may be performed to finish the formation of the semiconductor device. The processes include, for example, hard mask removal process, interlayer dielectric layer deposition process, a gate replacement process, a contact hole formation process, a metal silicidation process, another suitable process, or a combination thereof.

Figure 10A:
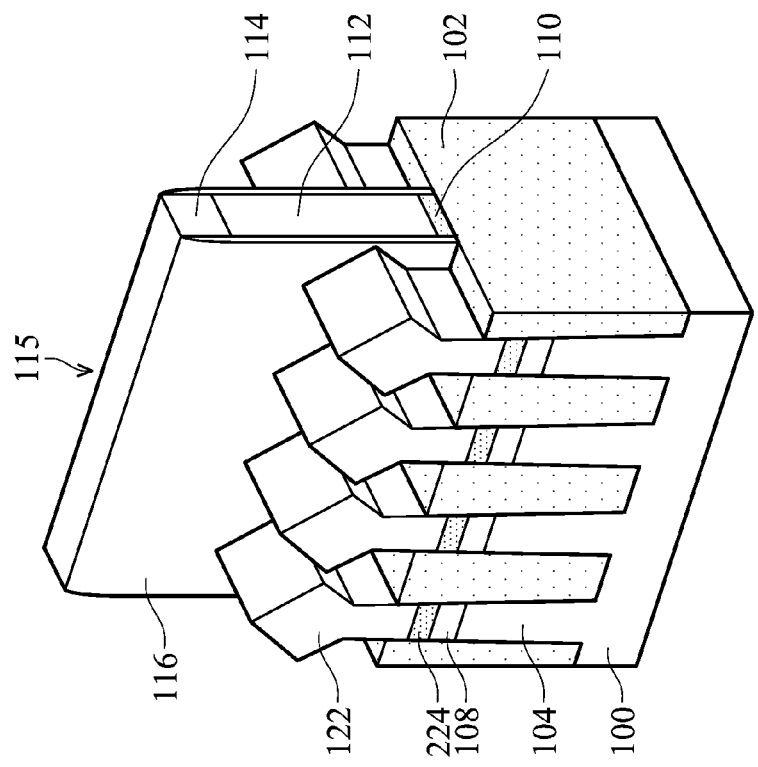
FIGS. 10A-10B are perspective views of various stages of a process for forming a semiconductor device structure, in accordance with some embodiments.
Figure 10B:
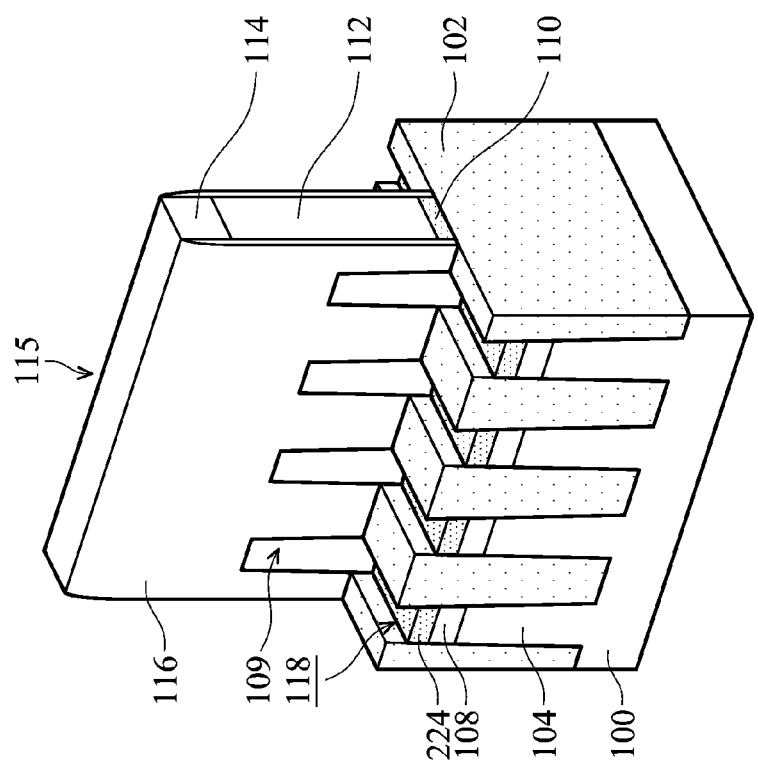

FIGS. 10A and 10B are perspective views of various stages of a process for forming a semiconductor device structure, in accordance with some embodiments. As shown in FIG. 10A, a structure similar to the structure shown in FIG. 7A is provided. Afterwards, isolation layers 224 are respectively formed over the fin structures 108, as shown in FIG. 10A in accordance with some embodiments. In some embodiments, a dielectric layer is deposited over the structure shown in FIG. 7A. The dielectric layer may be deposited using a CVD process, an ALD process, a thermal oxidation process, a spin-on process, another applicable process, or a combination thereof. Afterwards, an etching back process is performed to pattern the dielectric layer into the isolation layers 224. In some embodiments, the material of the isolation layers 224 are substantially the same as that of the isolation layer 124. The thickness of each of the isolation layers 224 may be in a range from about 0.2 nm to about 100 nm.

As shown in FIG. 10B, the source/drain structures 122 are respectively formed over the isolation layers 224, in accordance with some embodiments. The material and formation method of the source/drain structures 122 have been described above and are not repeated here. Due to the isolation layers 224, current leakage between the source/drain structures 122 are significantly reduced. Therefore, the product yield and device performance are greatly improved.

Figure 11B:
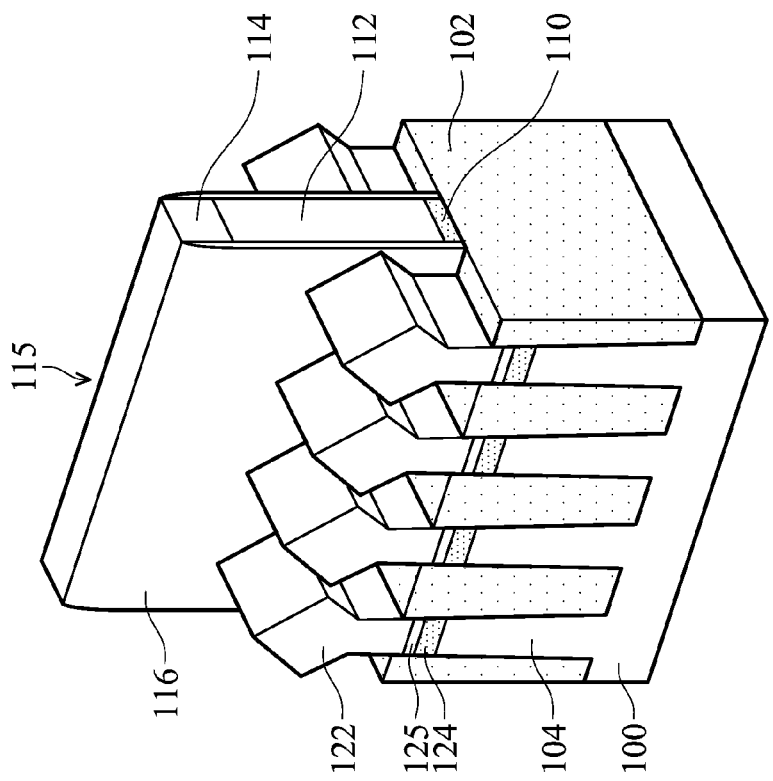
FIGS. 11A-11C are cross-sectional views of semiconductor device structures, in accordance with some embodiments.
Figure 11A:
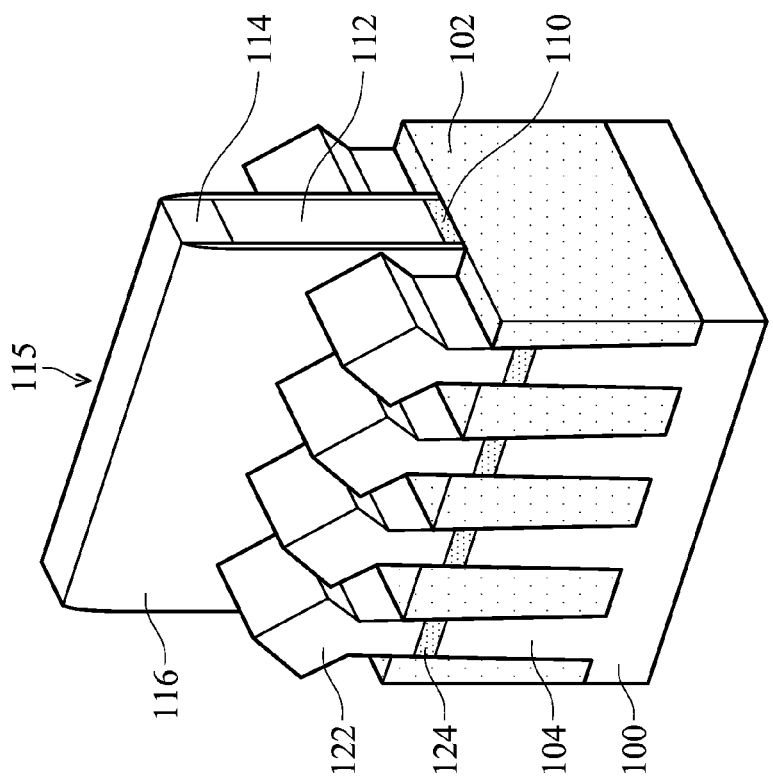

Many variations and modifications can be made to embodiments of the disclosure. For example, the upper portions of the fin structures 104 may not be replaced with other fin structures. In some embodiments, the silicon fin structure is not replaced with a silicon germanium fin structure or a germanium fin structure. FIG. 11A is a perspective view of a semiconductor device structure, in accordance with some embodiments. In some embodiments, a structure similar to the structure shown in FIG. 2 is provided. Afterwards, an etching process is performed to lower the isolation features 102. As a result, the fin structures 104 protrude from the top surfaces of the isolation features. Afterwards, various processes similar to those shown in FIGS. 6-9 are performed to form the structure shown in FIG. 11A. In some embodiments, each of the isolation layers 124 is in direct contact with the source/drain structure 122 and the fin structure 104 accordingly. Due to the isolation layers 124, current leakage between the source/drain structures 122 is significantly reduced. Therefore, the product yield and device performance are greatly improved.

Many variations and modifications can be made to embodiments of the disclosure. FIG. 11B is a perspective view of a semiconductor device structure, in accordance with some embodiments. Before the source/drain structures 122 are formed over the semiconductor layers 120 (such as those shown in FIG. 8) or the isolation layers 224 (such as those shown in FIG. 10), semiconductor layers 125 are formed over the isolation layers 124 (or 224). The semiconductor layers 125 may be used to assist in the growth of the source/drain structures 122.

In some embodiments, the semiconductor layers 125 are made of silicon germanium. In some embodiments, each of the semiconductor layers 125 has an atomic concentration of germanium that is smaller than that of the semiconductor layer 120 (see FIG. 8) or that of the source/drain structures 122. In some embodiments, the formation method of the semiconductor layers 125 is similar to those of the semiconductor layers 120 and the source/drain structures 122. In some embodiments, the semiconductor layers 120, the semiconductor layers 125, and the source/drain structures 122 are formed in-situ in the same process chamber. In some embodiments, the composition of the reaction gases are fine-tuned at different growth stages for growing the semiconductor layers 120, the semiconductor layers 125, and the source/drain structures 122. In some embodiments, each of the semiconductor layers 125 has a multilayer structure with multiple sub-layers. In some embodiments, each of the sub-layers has different atomic concentration of germanium. For example, the atomic concentration of germanium gradually increases along a direction towards the source/drain structure 122.

Figure 11C:
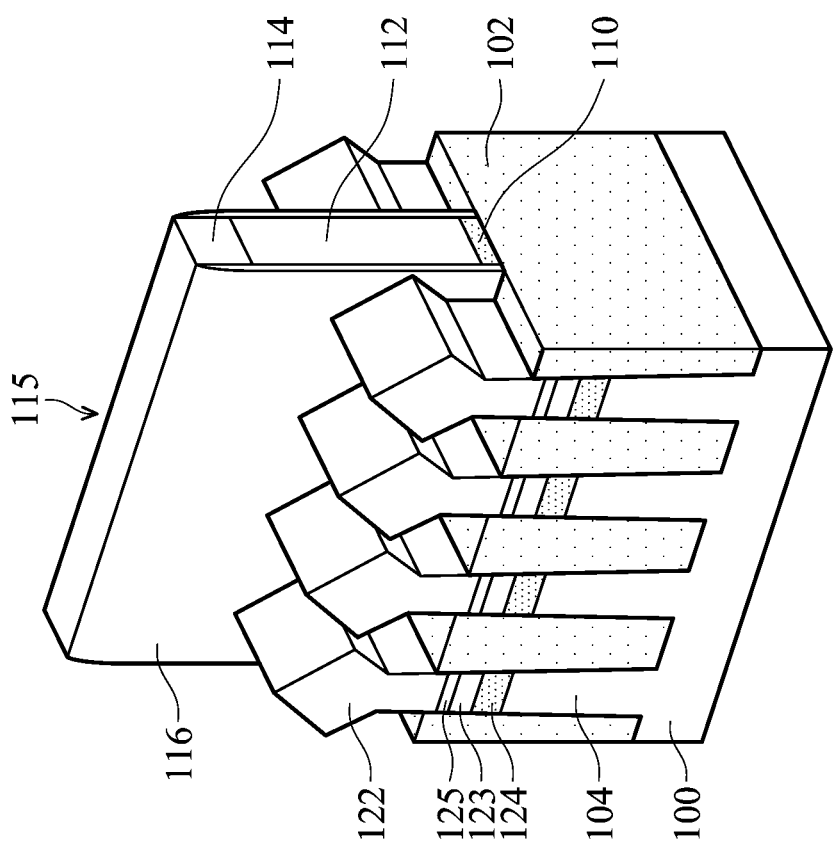

FIG. 11C is a perspective view of a semiconductor device structure, in accordance with some embodiments. In some embodiments, before the semiconductor layers 125 which can assist in the growth of the source/drain structures are formed, semiconductor layers 123 are formed, as shown in FIG. 11C. In some embodiments, the semiconductor layers 123 are made of silicon. In these cases, the isolation layers 124 are in direct contact with the fin structures 104 and are not in direct contact with the source/drain structures 122.

FIGS. 12A-12E are cross-sectional views of isolation layers of semiconductor device structures, in accordance with some embodiments. Due to different processing conditions, the isolation layer 124 may have different profiles. In some embodiments, the top surface 124t, the bottom surface 124b, and the side surface 124s of the isolation layer 124 are substantially planar, as shown in FIG. 12A.

In some embodiments, the top surface 124t and the bottom surface 124b are curved surfaces such as those shown in FIG. 12B or FIG. 12C. In some embodiments, the top surface 124t curves towards the fin structure under the isolation layer 124. In some embodiments, the bottom surface 124b curves towards the source/drain structure above the isolation layer 124. In some embodiments, the side surface 124s curves outwardly, as shown in FIG. 12C. In some embodiments, the isolation layer 124 has a "V-shaped profile", such as those shown in FIG. 12D or 12E.

Figure 13A:
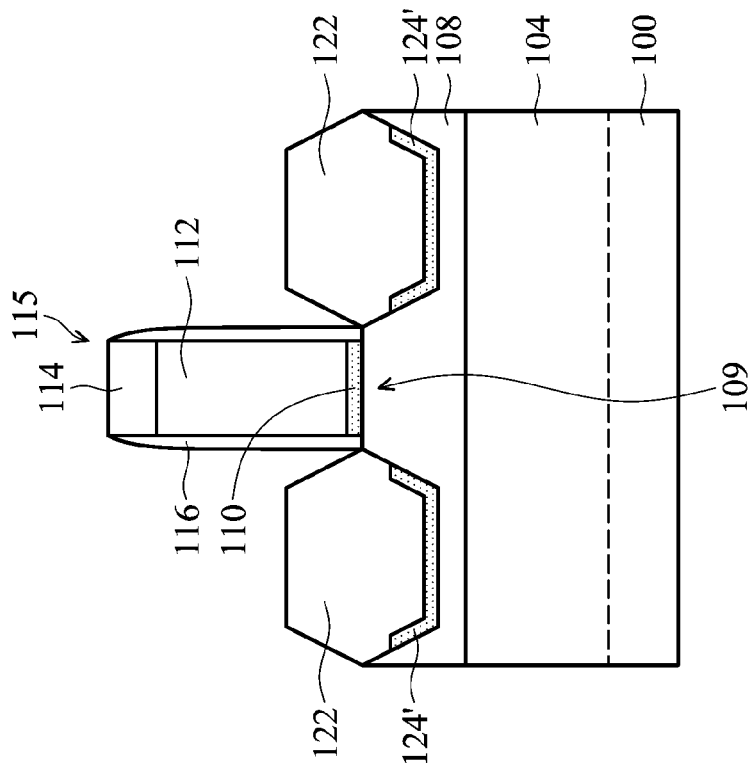
FIGS. 13A-13B are cross-sectional views of various stages of a process for forming a semiconductor device structure, in accordance with some embodiments.
Figure 13B:
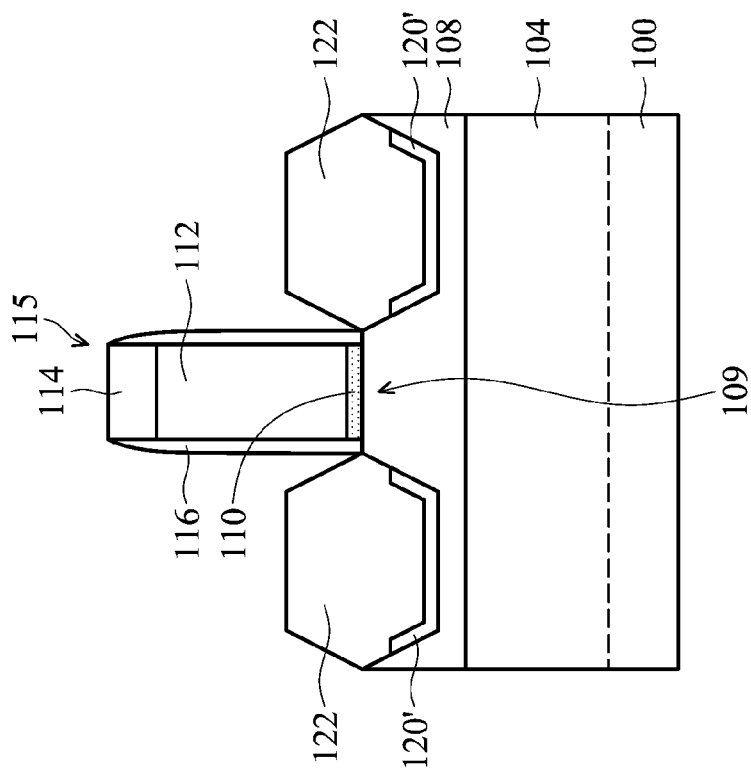

FIGS. 13A-13B are cross-sectional views of various stages of a process for forming a semiconductor device structure, in accordance with some embodiments. As shown in FIG. 13A, a structure similar to the structure shown in FIG. 8B is provided. In some embodiments, semiconductor layers 120' similar to the semiconductor layers 120 are formed. Each of the semiconductor layers 120' further extends over sidewalls of the recesses (118, see, for example, FIG. 7B). In some embodiments, by tuning the growth conditions of the semiconductor layers 120', the semiconductor layers 120' are also grown on the sidewalls of the recesses (118, see, for example, FIG. 7B).

Afterwards, the semiconductor layers 120' are oxidized to form the isolation layers 124', as shown in FIG. 13B in accordance with some embodiments. Portions of the isolation layers 124' are also positioned on the sidewalls of the recesses. Therefore, leakage current between the source/drain structures 122 may be prevented further. In some embodiments, an etching process is performed to etch back the semiconductor layer 120'. The semiconductor layers 120' are prevented from approaching the channel region 109 too much. After the oxidization operation, the isolation layers 124' are thus prevented from blocking the channel region 109. The formation method of the isolation layers 124' may be similar to those for forming the isolation layers 124.

Figure 14A:
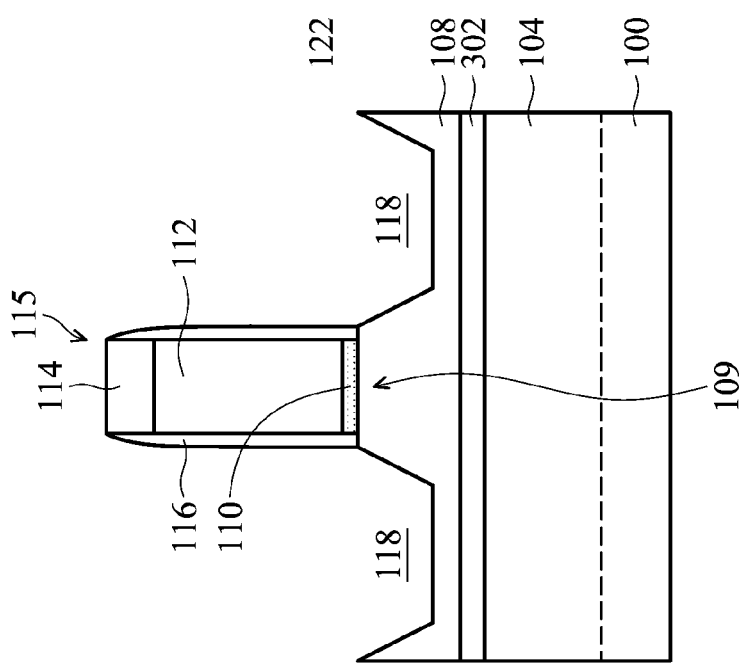
FIGS. 14A-14C are cross-sectional views of various stages of a process for forming a semiconductor device structure, in accordance with some embodiments.
Figure 14C:
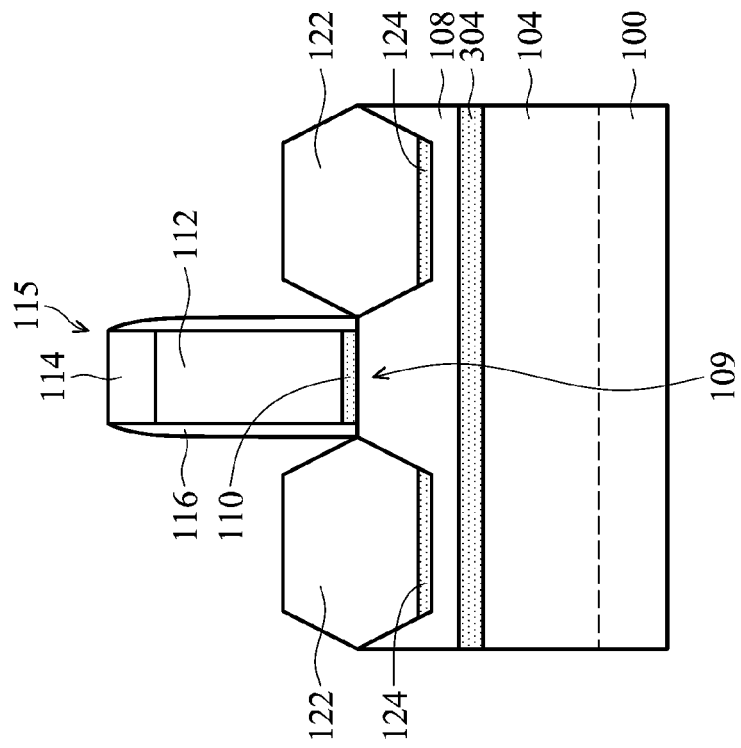
Figure 14B:
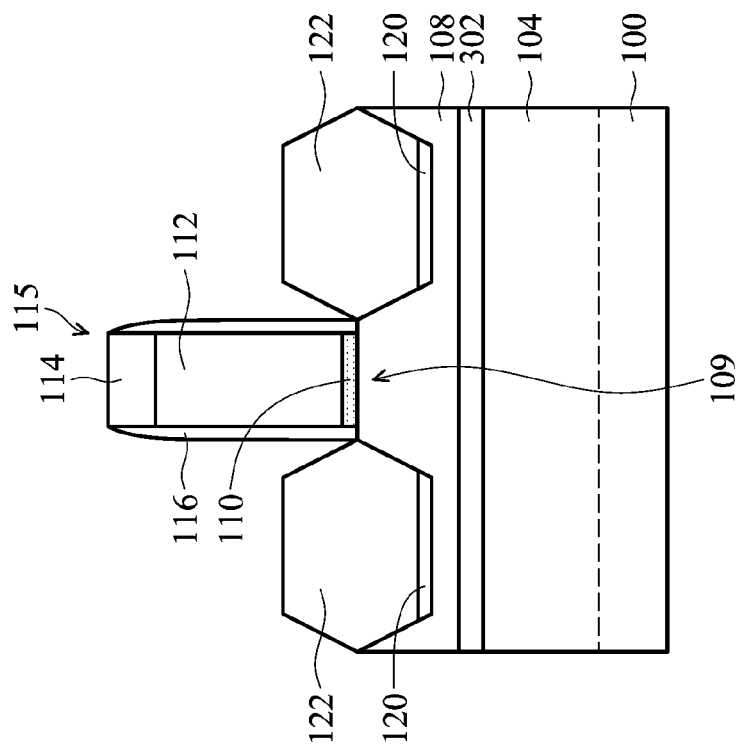

FIGS. 14A-14C are cross-sectional views of various stages of a process for forming a semiconductor device structure, in accordance with some embodiments. In some embodiments, a structure similar to the structure shown in FIG. 3 is provided. Before the fin structures 108 are formed over the fin structures 104, semiconductor layers 302 are formed over the fin structures 104. Afterwards, the fin structures 108 are formed over the semiconductor layers 302. The gate stack 115 is then formed over the fin structures, similar to those shown in FIGS. 4-6. Afterwards, an etching process similar to that shown in FIG. 7 is performed. As a result, the structure shown in FIG. 14A is formed.

As shown in FIG. 14B, similar to those shown in FIGS. 8A and 8B, the semiconductor layers 120 and the source/drain structures 122 are formed, in accordance with some embodiments. Afterwards, similar to those shown in FIGS. 9A and 9B, an annealing process or another applicable oxidation process is performed to oxidize the semiconductor layers 120 and 302 into the isolation layers 124 and 304, as shown in FIG. 14C in accordance with some embodiments. The isolation layer 304 may further enhance the blocking of the leakage current. In some other embodiments, the semiconductor layers 120 and the isolation layers 124 are not formed. In these cases, the isolation layer 304 between the source/drain structures 122 and the semiconductor substrate 100 are used to prevent the leakage current.

Figure 15A:
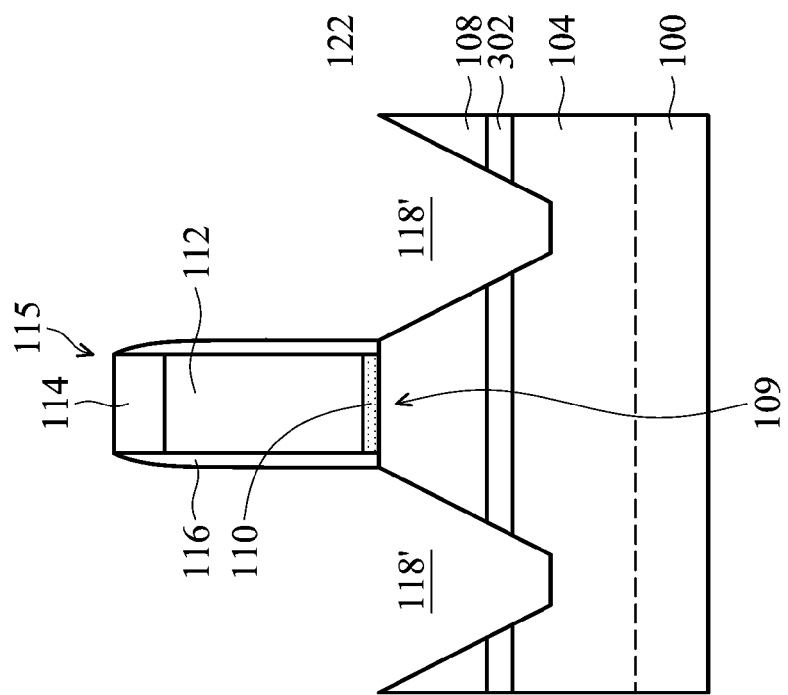
FIGS. 15A-15C are cross-sectional views of various stages of a process for forming a semiconductor device structure, in accordance with some embodiments.
Figure 15C:
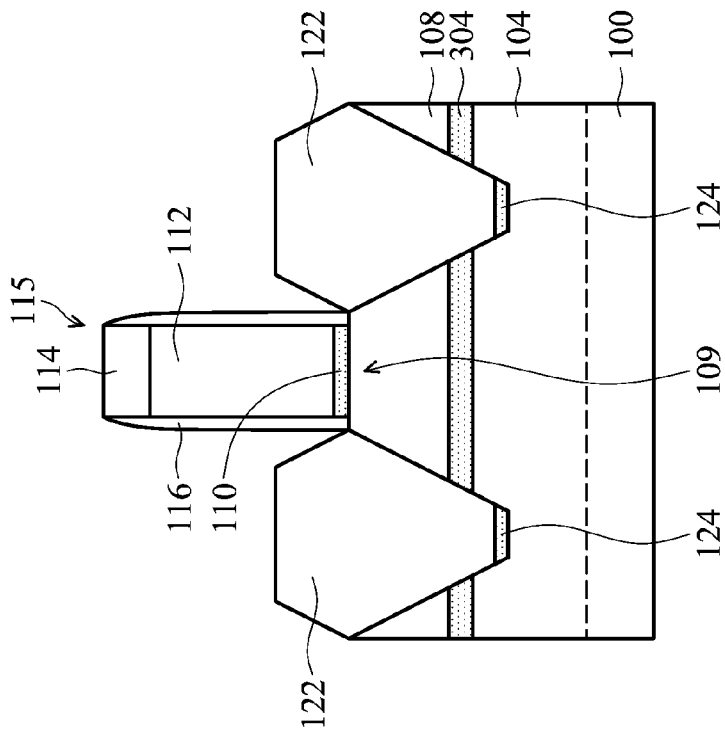
Figure 15B:
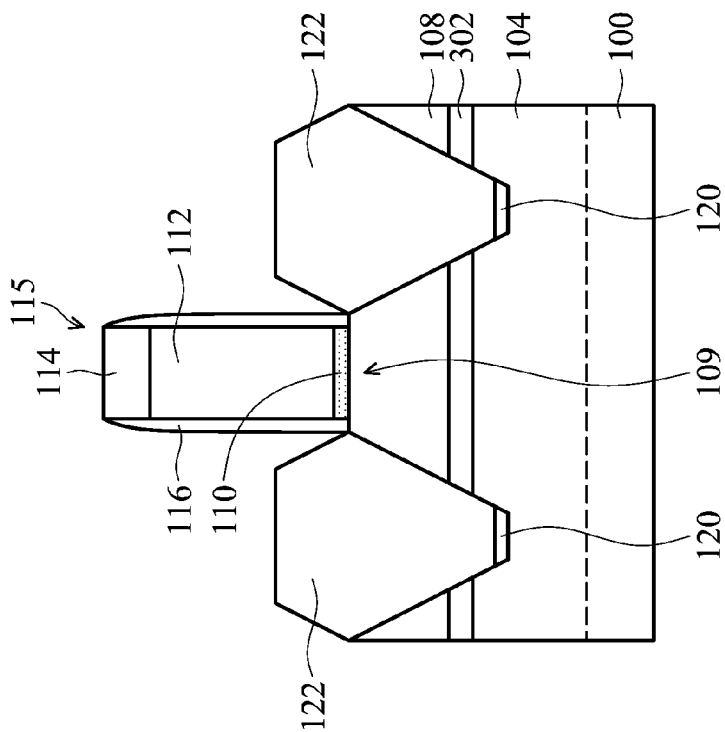

Many variations and modifications can be made to embodiments of the disclosure. FIGS. 15A-15C are cross-sectional views of various stages of a process for forming a semiconductor device structure, in accordance with some embodiments. As shown in FIG. 15A, a structure similar to the structure shown in FIG. 14A is provided. Different from the recesses 118, the recesses 118' further penetrate through the semiconductor layer 302 and extend into the fin structures 104, as shown in FIG. 15A. An etching process similar to that described in FIG. 7A or 7B is used to form the recesses 118'. The etching conditions are fine-tuned to form the recesses 118' extending into the fin structures 104.

Afterwards, as shown in FIG. 15B, similar to the embodiments shown in FIG. 14B, the semiconductor layers 120 and the source/drain structures 122 are formed, in accordance with some embodiments. In some embodiments, portions of the source/drain structures 122 extend into the fin structure 104 below the isolation layer 304, as shown in FIG. 15C. Afterwards, similar to the embodiments shown in FIG. 14C, an annealing process or another applicable oxidation process is performed to oxidize the semiconductor layers 120 and 302 into the isolation layers 124 and 304, as shown in FIG. 15C in accordance with some embodiments. The isolation layer 304 may further enhance the blocking of the leakage current. In some other embodiments, the semiconductor layers 120 and the isolation layers 124 are not formed. In these cases, the isolation layer 304 between the source/drain structures 122 and the semiconductor substrate 100 are used to prevent the leakage current.

Figure 16:
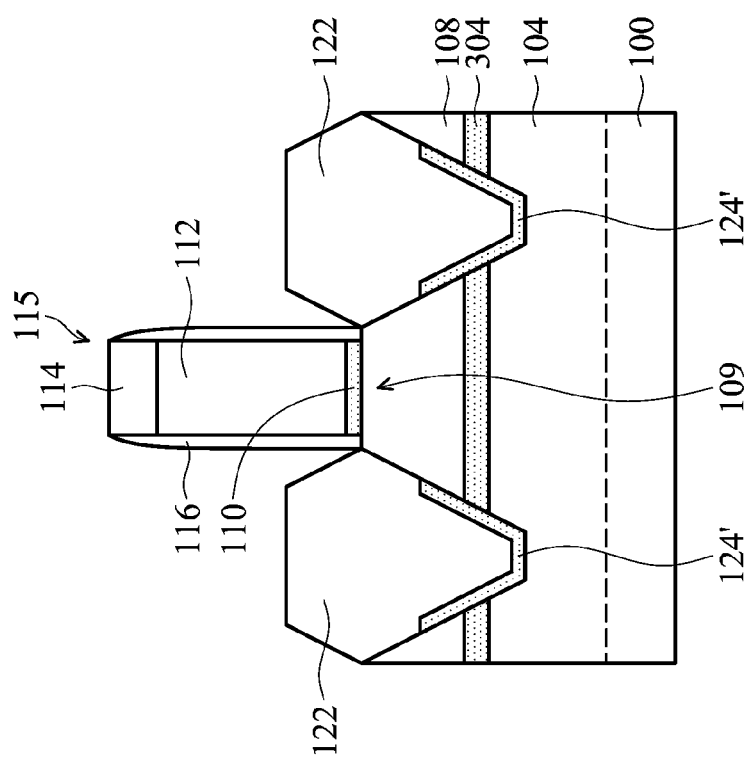
FIG. 16 is a cross-sectional view of a semiconductor device structure, in accordance with some embodiments.

Many variations and modifications can be made to embodiments of the disclosure. FIG. 16 is a cross-sectional view of a semiconductor device structure, in accordance with some embodiments. FIG. 16 shows a structure that is similar to that shown in FIG. 15C. In some embodiments, similar to the embodiments shown in FIG. 13A, the semiconductor layer 120 further extends over a portion of the sidewalls of the recesses 118'. Therefore, after the oxidation process, the semiconductor layer 120 is turned into the isolation layers 124', as shown in FIG. 16 in accordance with some embodiments. As shown in FIG. 16, each of the isolation layers 124; further extends over portions of the sidewalls of the recesses. The isolation may therefore be improved.

Embodiments of the disclosure form an isolation layer between a source/drain structure and a fin structure under the source/drain structure. A semiconductor layer is formed over the fin structure, and the source/drain structure is then formed over the semiconductor layer. An oxidation operation such as an annealing process is performed to oxidize the semiconductor layer to be the isolation layer. Alternatively, the isolation layer is formed over the fin structure before the formation of the source/drain structure. The isolation layer prevents current leakage between the source/drain structures of neighboring FinFET devices or the same FinFET device. As a result, the performance and reliability of the device are significantly improved.

In accordance with some embodiments, a semiconductor device structure is provided. The semiconductor device structure includes a semiconductor substrate and a fin structure over the semiconductor substrate. The semiconductor device structure also includes a gate stack covering a portion of the fin structure and a source/drain structure over the fin structure and adjacent to the gate stack. The semiconductor device structure further includes an isolation layer between the source/drain structure and the semiconductor substrate.

In accordance with some embodiments, a semiconductor device structure is provided. The semiconductor device structure includes a semiconductor substrate and a fin structure over the semiconductor substrate. The semiconductor device structure also includes a germanium-containing fin structure over the fin structure and a gate stack covering a portion of the germanium-containing fin structure. The semiconductor device structure further includes a source/drain structure over the germanium-containing fin structure and adjacent to the gate stack. In addition, the semiconductor device structure includes an isolation layer between the source/drain structure and the semiconductor substrate.

In accordance with some embodiments, a method for forming a semiconductor device structure is provided. The method includes forming a fin structure over a semiconductor substrate and forming a gate stack to cover a portion of the fin structure. The method also includes forming a source/drain structure over the fin structure and adjacent to the gate stack. The method further includes forming an isolation layer between the source/drain structure and the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a semiconductor substrate;
a fin structure over the semiconductor substrate;
a gate stack covering a portion of the fin structure;
a source/drain structure over the fin structure and adjacent to the gate stack; and
an isolation layer between the source/drain structure and the semiconductor substrate, wherein the isolation layer is directly under the source/drain structure.

2. The semiconductor device structure as claimed in claim 1, wherein the isolation layer is between the source/drain structure and the fin structure.

3. The semiconductor device structure as claimed in claim 1, wherein the isolation layer is in direct contact with the source/drain structure.

4. The semiconductor device structure as claimed in claim 1, wherein the isolation layer is in direct contact with the fin structure.

5. The semiconductor device structure as claimed in claim 1, wherein the isolation layer is made of silicon germanium oxide.

6. The semiconductor device structure as claimed in claim 1, further comprising a semiconductor material layer between the isolation layer and the source/drain structure.

7. The semiconductor device structure as claimed in claim 6, wherein the source/drain structure has an atomic concentration of germanium greater than that of the semiconductor material layer.

8. The semiconductor device structure as claimed in claim 1, wherein the isolation layer has a bottom surface curved towards the source/drain structure.

9. The semiconductor device structure as claimed in claim 1, further comprising a second fin structure between the fin structure and the semiconductor substrate, wherein materials of the fin structure and the second fin structure are different from each other.

10. The semiconductor device structure as claimed in claim 9, further comprising a second isolation layer between the fin structure and the second fin structure, wherein the second isolation layer is in direct contact with the second fin structure and the first fin structure.

11. The semiconductor device structure as claimed in claim 1, wherein the isolation layer has a V-shaped profile.

12. The semiconductor device structure as claimed in claim 1, wherein the isolation layer has a top surface curved towards the fin structure under the isolation layer.

13. The semiconductor device structure as claimed in claim 1, further comprising a recess formed above the fin structure, wherein a portion of the isolation layer is disposed on a sidewall of the recess.

14. A semiconductor device structure, comprising:
a semiconductor substrate;
a fin structure over the semiconductor substrate;
a germanium-containing fin structure over the fin structure;
a gate stack covering a portion of the germanium-containing fin structure;
a source/drain structure over the germanium-containing fin structure and adjacent to the gate stack; and
an isolation layer between the source/drain structure and the semiconductor substrate, wherein the isolation layer is directly under the source/drain structure.

15. The semiconductor device structure as claimed in claim 14, wherein the isolation layer is between the source/drain structure and the germanium-containing fin structure.

16. The semiconductor device structure as claimed in claim 15, further comprising a second isolation layer between the fin structure and the germanium-containing fin structure.

17. The semiconductor device structure as claimed in claim 14, wherein the isolation layer is between the fin structure and the germanium-containing fin structure.

18. The semiconductor device structure as claimed in claim 14, wherein a portion of the source/drain structure extends into the fin structure.

19. The semiconductor device structure as claimed in claim 14, further comprising a semiconductor material layer between the isolation layer and the source/drain structure.

20. The semiconductor device structure as claimed in claim 19, wherein the source/drain structure has an atomic concentration of germanium greater than that of the semiconductor material layer.

* * * * *